United States Patent [19]

Vaidya et al.

[11] Patent Number: 5,076,203
[45] Date of Patent: Dec. 31, 1991

[54] COATING APPARATUS FOR THIN PLASTICS WEBS

[75] Inventors: Ashok W. Vaidya, High Wycombe; James L. S. Wales, Caversham; Robert A. Woolley, Uxbridge, all of England

[73] Assignee: Thorn EMI plc, London, England

[21] Appl. No.: 626,320

[22] Filed: Dec. 13, 1990

Related U.S. Application Data

[63] Continuation of Ser. No. 254,088, Oct. 6, 1988, abandoned.

[30] Foreign Application Priority Data

Oct. 7, 1987 [GB] United Kingdom ............... 8723545
Oct. 9, 1987 [GB] United Kingdom ............... 8723774

[51] Int. Cl.$^5$ ............................................. C23C 16/00
[52] U.S. Cl. ............................ 118/718; 118/724; 118/726; 118/730; 118/732; 165/90; 427/251; 427/255.5
[58] Field of Search ............... 118/718, 719, 724, 726, 118/730, 732, 733; 165/90; 204/298.24; 427/255.5, 251

[56] References Cited

U.S. PATENT DOCUMENTS

| | | | |
|---|---|---|---|
| 3,245,334 | 4/1966 | Long | 34/242 |
| 3,414,048 | 12/1968 | Rall | 165/1 |
| 4,451,501 | 5/1984 | Nagao et al. | 427/40 |
| 4,655,167 | 4/1987 | Nakamura et al. | 118/718 |

FOREIGN PATENT DOCUMENTS 0053811 6/1982 European Pat. Off.
3050805 3/1985 Fed. Rep. of Germany.

OTHER PUBLICATIONS

"Metal Thin Film Video Tape by Vacuum Deposition," by Maezawa et al., The 4th International Conference on Video and Data Recording, The Univ. of Southampton, Hampshire, England, Apr. 20-23 1982, IEEE Conference Proceedings No. 54, pp. 1-9.

Primary Examiner—Shrive Beck
Assistant Examiner—Terry J. Owens
Attorney, Agent, or Firm—Fleit, Jacobson, Cohn, Price, Holman & Stern

[57] ABSTRACT

Coating apparatus for a thin plastics web comprises a coating deposition station for applying a coating to the web by vapor deposition and a support for supporting the web at the coating deposition station. The apparatus includes a device for urging gas into the region where the thin plastics web converges with the support to improve the thermal coupling between the web and the support and also to reduce the coefficient of friction between the web and support. The gas enables the coating to be applied by vapor deposition at coating speeds of up to 90 meters per minute without deformation of the thin plastics web.

11 Claims, 6 Drawing Sheets

COATING APPARATUS FOR THIN PLASTICS WEBS

This is a continuation of application Ser. No. 07/254,088, filed Oct. 6, 1988, now abandoned.

The present invention is related to an apparatus and a method for the production of a coating on a web. In particular, the present invention is related to the vacuum deposition of thin films on to flexible substrates and is particularly, but not exclusively, suitable for use in the manufacture of recording tape in which the recording medium is an evaporated thin film of a magnetic metal such as cobalt-nickel.

Webs of flexible plastics material may be continuously coated with metallic thin films in a roll coating apparatus such as is described, for example, in the paper "Metal Thin Film Tape by Vacuum Deposition" by Y. Maezawa et al published in the Proceedings of the Fourth International Conference on Video and Data Recording, IERE Conference Proceedings No. 54, 1983. In such apparatus, the plastics web is tightly spooled over a rotating cooling drum positioned above an evaporation source. The plastics web material, during deposition, receives a very high heat load during deposition from condensing metal and from radiant heat which increases with the deposition rate and thus, when operating at high coating speeds, this heat load may cause the web material to wrinkle and crease on the drum and suffer permanent damage. When coating, for example, 100 nm films of cobalt-nickel on to webs of 12 micrometer polyethylene terephthalate for recording tape, it has generally been found that such permanent damage occurs when the web is coated at a linear speed which exceeds about 10 meters per minute. The thermal conductance between the web and the cooling drum plays an important role in controlling the temperature rise of the web as it is coated, and sets an upper limit to coating speed for a given web and film combination.

An alternative coating apparatus in which the rotating drum is replaced by a fixed cooling guide is disclosed in U.S. Pat. No. 4,451,501. In such apparatus, the thermal conductance between the web and the fixed guide plays a similarly important role in controlling the temperature rise of the web.

It is an object of the present invention to provide an improved vacuum deposition apparatus having increased thermal conductance between a web and a cooling member.

Prior art coating apparatus operate with the web in contact with either a rotating drum or a fixed cooling guide under conditions of comparatively high friction. Additional creasing of the web may be introduced due to lateral expansion of the heated web while in frictional contact with the drum or cooling guide.

It is a further object of the present invention to provide an improved vacuum deposition apparatus in which a web passes over a cooling member under low friction conditions.

The present invention provides an apparatus for the production of a coating on a web, the apparatus comprising:

means for passing a web, onto which a coating is to be deposited, to a coating-deposition station;

means for supporting the web at the coating-deposition station;

means for applying a coating to the web at the coating-deposition station;

means for urging gas into a region between the web and the support means.

In this way, the speed of manufacture of coated web of an acceptable quality can be increased.

The gas may be injected in the form of one or more fine jets, and/or one or more broad streams; optionally the gas may be injected such as to be focussed to a point or to a line. Preferably, the urging means comprises means for injecting one jet or a plurality of spaced jets of gas to a region in which the web and the support means converge for effective contact therebetween. Additionally or alternatively the urging means comprises a conduit for the passage of gas to a nozzle which has at least one aperture for the output of a stream of gas.

Preferably the injection means is arranged to inhibit leakage of gas to the winding zone remote from the convergence region, and to enhance trapping of the gas between the web on the support means. Thus the injection means may be close-fitting to the support means and the web so that high pressure can be contained without substantial raising of winding zone pressure.

Preferably the support means has at least one section of porous material, and the injection means includes means to urge gas through the porous section(s).

The present invention is especially suited to the metallisation of webs. Thus preferably the apparatus comprises means to apply a metallisation vapour to the web at the coating-deposition station. However, the present invention is also applicable to appropriate methods of coating webs with non-metallic materials.

The support means may comprise a rotatable drum with cooling means, or a static guide plate; in the latter case, the reduced frictional effects between the web and the support which are due to the invention can result in the provision of a mechanical oscillator not being necessary.

The present invention also provides a method for the production of a coating on a web, the method comprising:

passing a web, onto which a coating is to be deposited, to a coating-deposition station;

supporting the web at the coating-deposition station;

urging gas into a region between the web and means for supporting the web at the coating-deposition station; and applying a coating to the web at the coating-deposition station.

Preferably, the method comprises injecting one jet or a plurality of spaced jets of gas to a region in which the web and the support means converge for effective contact therebetween.

Also, preferably the method comprises passing gas along a conduit to a nozzle which has at least one aperture for the output of a stream of gas.

The method may comprise urging gas through at least one porous section of the support means.

Preferably, the method comprises applying a metallisation vapour to the web at the coating-deposition station.

In the present invention, any gas appropriate to the coating material may be used. Thus for example, air is particularly suitable for the deposition of cobalt nickel. Other gases which may be suited to the deposition of materials by evaporation are oxygen, argon and water vapour.

The present invention is applicable to the production of metallised webs (for example in the manufacture of magnetic recording tapes, or of capacitors and other electrical components, or of decorative films) and to the production of webs coated with non-metallic materials (for example in the manufacture of optical recording tapes).

Embodiments of the invention will now be described, by way of example only, with reference to the accompanying drawings in which.

Figure 1:
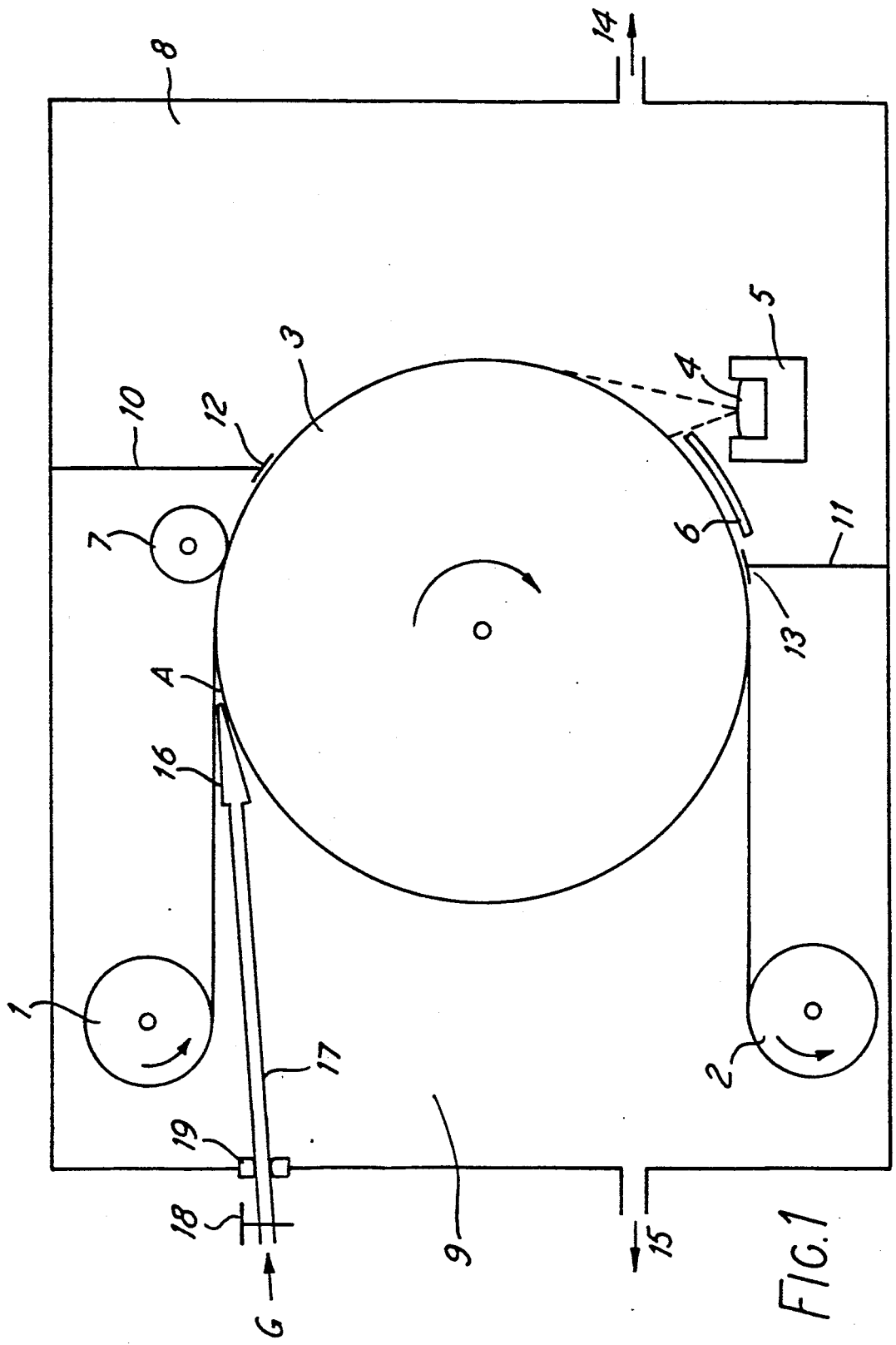
FIG. 1 is a schematic side view of a roll coating apparatus suitable for the production of recording tape.

The lay-out of the apparatus of FIG. 1 is generally similar to conventional semi-continuous roll-coating apparatus for the production of evaporated magnetic film recording tape. Thus, a web of plastics base film is fed from a supply spool 1 to a take-up spool 2 over a hollow rotating cooling drum 3 through which a cooling fluid is continuously circulated. A source metal 4 of, typically, cobalt-nickel alloy is heated in a crucible 5 by means of an electron beam heater (not shown) and a masking shield 6 ensures that source metal is evaporated on to the plastics web material while in contact with the drum at a high angle of incidence. A rubber nip roller 7 lightly urges the web material against the drum. The drum width is typically in the order of 730 mm, enabling a web of width 700 mm to be coated, and the drum diameter is typically of the order of 1.5 meters. The assembly is mounted in an evaporation chamber having two compartments. The right-hand compartment 8 is the evaporation zone, and encloses the crucible 5, the electron beam heater and the shield 6. The left-hand compartment 9 is the winding zone and encloses the supply and take-up spools 1, 2 and the nip roller. Additional guiding and tensioning rollers may be provided in the winding zone, in known manner. The evaporation and winding zones are separated by wall portions 10 and 11, with low conductance seals 12, 13 provided in close proximity to the drum surface, thereby minimising the penetration of any contaminating components from the winding zone into the evaporation zone. The evaporation zone and the winding zone are separately connectable by outlet pipes 14 and 15 to vacuum pumps (not shown), and before a coating operation, each zone is normally pumped to a pressure of about $10^{-4}$ mbar. The components so far described have been used in prior art apparatus with the base film running in close frictional contact with the peripheral surface of the drum as it is coated.

Figure 2:
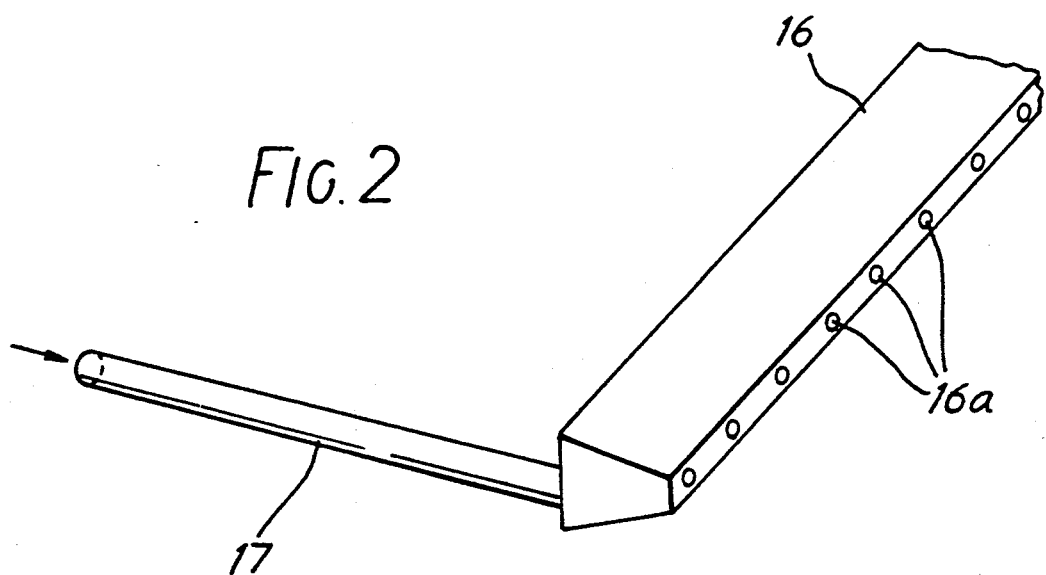
FIG. 2 is a perspective view of an injection nozzle and gas inlet pipe.

In this embodiment of the present invention there is provided a means of injecting a gas between the base film and the cooling drum at the positions where the web is laid onto the drum. An injection nozzle 16, extending substantially across the full width of the web, is positioned between the web and the drum at this position. The nozzle 16, shown in FIG. 2, is of a closed hollow construction with tapered upper and lower walls. A line of outlet holes 16a, typically of 1.5 mm diameter at 15 mm pitch, are provided in the front wall, and an inlet pipe 17 attached to the rear wall of the nozzle communicates with a gas source G outside the chamber. The dimensions of the nozzle 16, and its positioning in relation to drum 3 and the base film, are chosen such that the gap between the nozzle outlet and the drum/base film is about 1 mm; in this way, leakage of gas to winding zone is inhibited. The gas source, for the deposition of cobalt nickel, is suitably normal atmosphere and the introduction of gas may be controlled by means of a needle valve 18. The inlet pipe passes through a wall of the chamber and a suitable vacuum seal 19 is provided.

Figure 3:
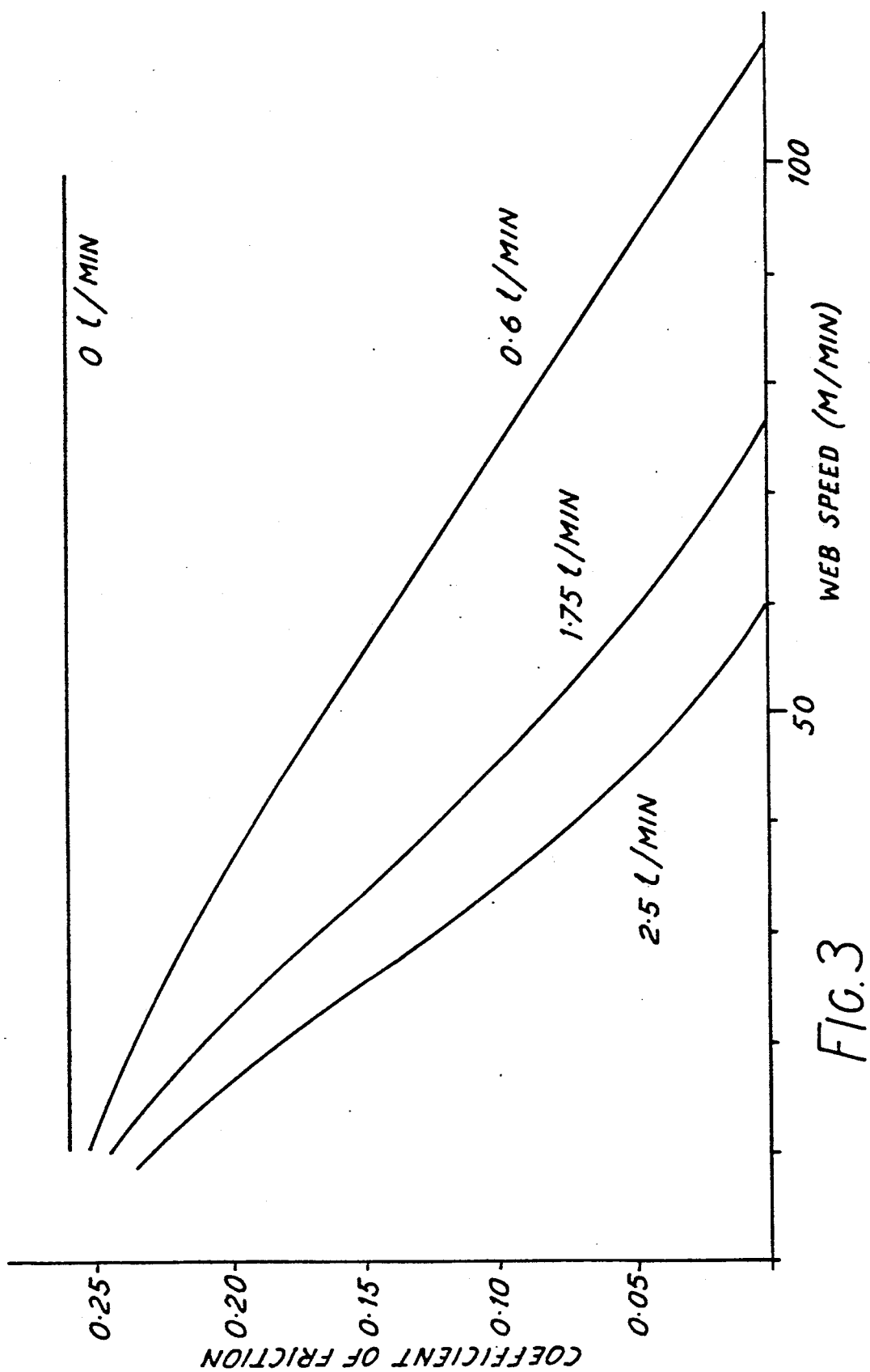
FIG. 3 is a graph of friction measurements associated with the apparatus of FIG. 1.

Prior to evaporation, the needle valve 18 is closed and the evaporation and winding zones are both evacuated to a pressure of approximately $10^{-4}$ mbar. The needle valve is then opened to inject air into the region A between the base film and the drum at a localised pressure in the order of 1 to 10 mbar, and the air injection is maintained throughout a coating operation. We have found that the injection of air in this way assists the conduction of heat at the interface between the base film and the cooling drum and we have been able to coat 12 micrometer base films of polyethylene terephthalate with 100 nm cobalt-nickel at web speeds of 30 to 90 meters per minute without any damage being caused to the base film; recording tapes slit from such coated webs have performed satisfactorily. In contrast, when operating under prior art conditions, with the valve 18 fully closed throughout a coating operation, the base film was severely damaged with permanent creases and crinkles when coating runs were attempted at speeds exceeding 10 meters per minute. The air injection is believed to cause a thin film of air and/or pockets of air to become entrapped between the facing surfaces of the base film and the drum as the film is coated, this air film/pockets providing a continuous heat conducting path between the base film and the drum, regardless of any minute surface asperities present on the facing surfaces of the drum and the base film, thereby increasing the thermal conductance between these surfaces. Measurement of the comparative friction values for no gas injection and for gas injection indicate the presence of an air film. Thus, with no gas injection, the friction coefficient was measured as 0.26, while the friction coefficient falls to 0.01 or less with gas injection. FIG. 3 is a graph of drum-web friction as a function of web speed for four values of air injection, the tension of the web as it leaves the drum being 50 Kgf. Also measurements of thermal conductance between drum and web show at least a tenfold improvement upon gas injection.

While traces of air inevitably leak into the evaporation zone through the conductance seals 12, 13 and from the sides of the base film, such leakage has not adversely affected the properties of the deposited cobalt-nickel films. Alternative gases such as oxygen, argon or water vapour may be injected should alternative atmospheres be required in the evaporation zone.

It will be appreciated that, at the position of the rubber nip roller 7, the base film will contact the drum and it is perhaps surprising that this contact does not provide a barrier preventing the air film from reaching the evaporation zone. We attribute our satisfactory results when using a nip roller to the fact that such contact is not in fact perfect, and sufficient air is compressed into the microscopic voids between contacting asperities to provide the heat conducting air film and for the web to pass over the drum, after leaving the nip roller, with very low friction. A nip roller is not essential to the invention, however, and in an alternative embodiment, the nip roller could be replaced by a motor driven capstan motor situated downstream of the drum in the winding zone.

Figure 4:
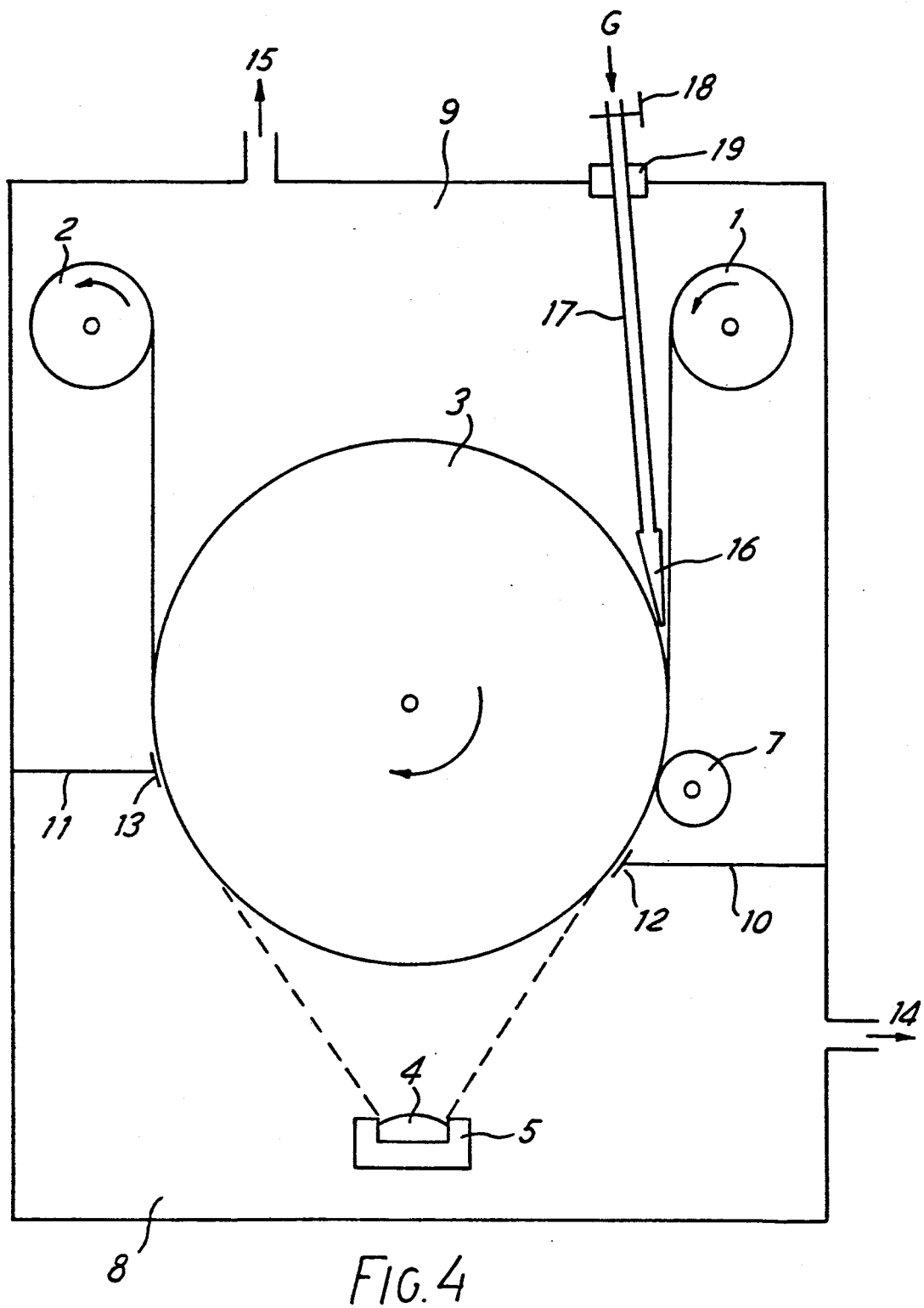
FIG. 4 is a schematic side view of a roll coating apparatus suitable for the production of decorative film.

Many applications of vacuum deposition techniques do not require a high angle of incidence. Such applications include aluminised decorative foils and metallised plastics films for use in capacitors and other electrical devices. The invention may be readily applied to such applications, as is shown in the apparatus of FIG. 4 in which the winding zone 9 lies directly above the evaporation zone 8 and the crucible 5 and evaporation source 4 lie directly beneath the drum axis in order to give maximum coverage of the base film during coating. FIG. 4 uses equivalent reference numerals to FIG. 1.

Alternative embodiments of the invention may utilise a fixed cooling guide in preference to a rotating cooling drum. In prior arrangements, as are disclosed in U.S. Pat. No. 4,451,501, the web has run in sliding contact with a fixed cooling guide and, in order to reduce friction to an acceptable level, means have been provided to mechanically oscillate the cooling guide.

Figure 5:
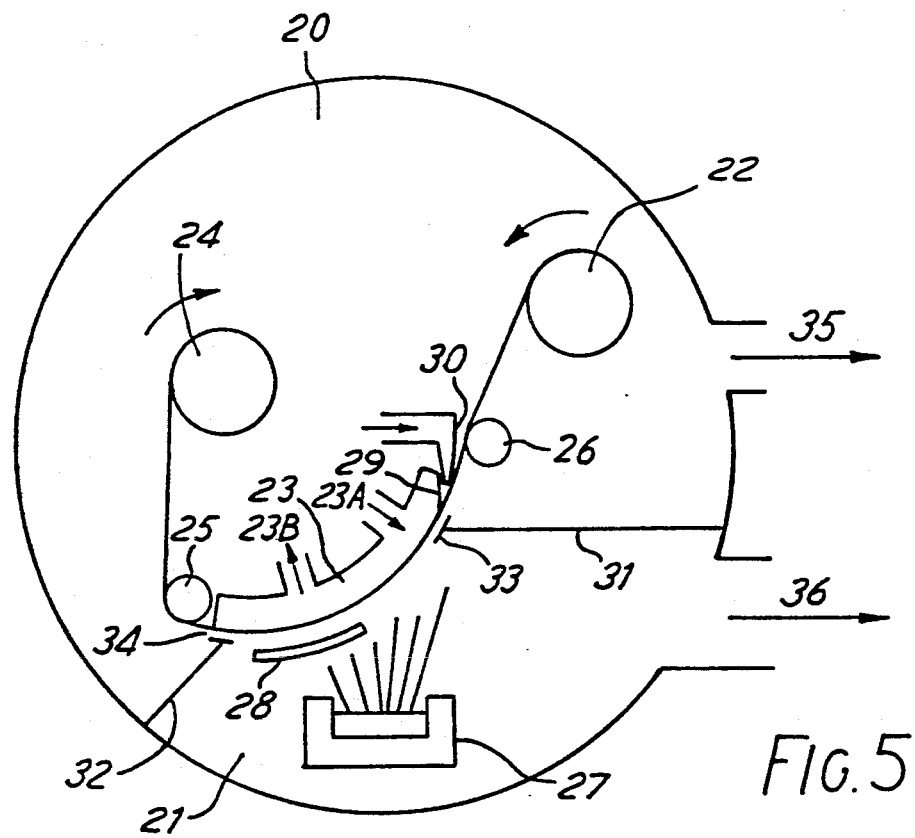
FIG. 5 is a schematic side view of a fixed guide coating apparatus suitable for the production of recording tape.

FIG. 5 shows an embodiment of the present invention suitable for the evaporation of a cobalt-nickel recording medium on to a web. An evaporation chamber includes a winding zone 20 disposed above an evaporation zone 21. A plastics web is spooled from a supply spool 22 over a fixed convex cooling guide 23 on to a take-up spool 24. A motor driven capstan 25 downstream of the convex guide controls the speed of the web, and a guide-roller 26 is provided upstream of the web. The convex guide 23 is hollow and cooling fluid continuously circulates via an inlet 23A and an outlet 23B. The guide is positioned above an evaporation crucible 27, and is suitably profiled, in combination with a shield 28, for evaporation at a high angle of incidence. The entry face 29 of the fixed guide is tapered and a gas injector nozzle 30 of generally similar construction to the injector of FIG. 2 is arranged to inject gas between the web and the face 29 during a coating operation such that a thin film of air is formed at the interface between the fixed guide and the plastics web.

Walls 31 and 32, with low conductance seals 33 and 34, separate the winding and evaporation zones, and outlets 35 and 36 are provided for separately evacuating the zones. The thin film of air at the interface between the web and the fixed guide provides, as in the earlier embodiments of the invention, improved heat conductance to the member 23 as the evaporated metal condenses, thereby enabling a higher spooling speed without damage to the base film. Furthermore, the web passes over the guide under substantially zero friction conditions, and there is no requirement for mechanical oscillation of the guide.

Figure 6:
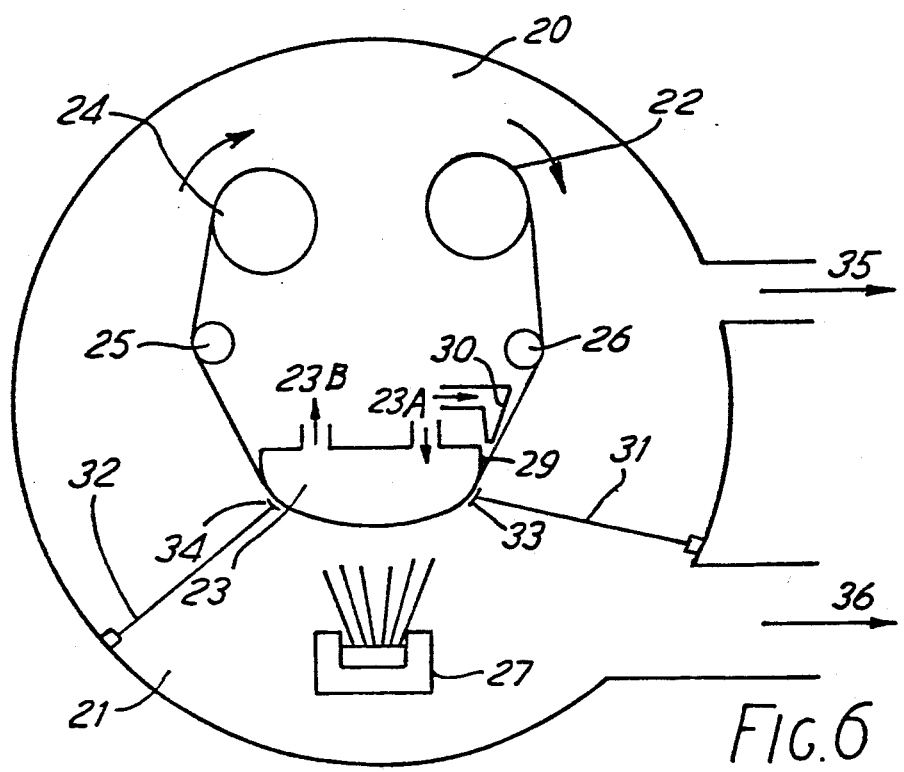
FIG. 6 is a schematic side view of a fixed guide coating apparatus suitable for the production of decorative film.

An embodiment of the invention using a fixed cooling guide and being suitable for applications which do not require a high angle of incidence is shown in FIG. 6. The cooling guide is mounted substantially horizontally, with no shield, in order to give maximum coverage to the base film during coating. FIG. 6 uses equivalent reference numerals to FIG. 5, and is suitable for the high speed coating of decorative aluminised foils. The gas injection nozzles of FIGS. 5 and 6 are provided with gas inlet pipes in similar manner to the embodiments of FIGS. 1 and 4, and may similarly communicate with normal air atmosphere, or with suitable alternative gases.

In a modification to any of the illustrated embodiments, the drum or fixed support is formed of porous material through which gas is made to pass in order to form a gas layer or film intermediate the drum/support and the base film. This feature may be additional, or alternative, to the nozzle-injection of gas. Appropriate forms of porous sintered metal, porous carbon or porous ceramic (for example silicon carbide materials) may be used to produce suitable constructions of support/drum, examples being shown in FIGS. 7 to 10.

Figure 7:
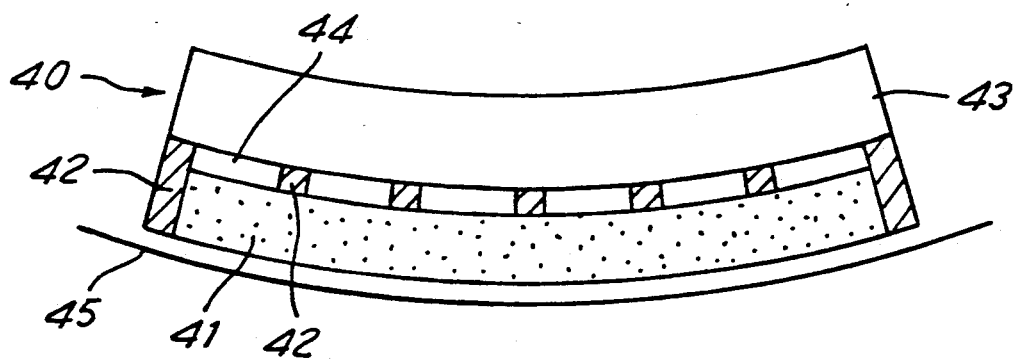
FIGS. 7, 8, 9 and 10 show modifications to apparatus embodying the present invention.

Thus in FIG. 7, support 40 has a porous outer layer 41, metal bars 42 to conduct heat from the porous support to a water-cooled chamber 43, while gas under pressure is supplied to channels 44 for outflow through the porous layer 41 to lift the base film 45.

Figure 8:
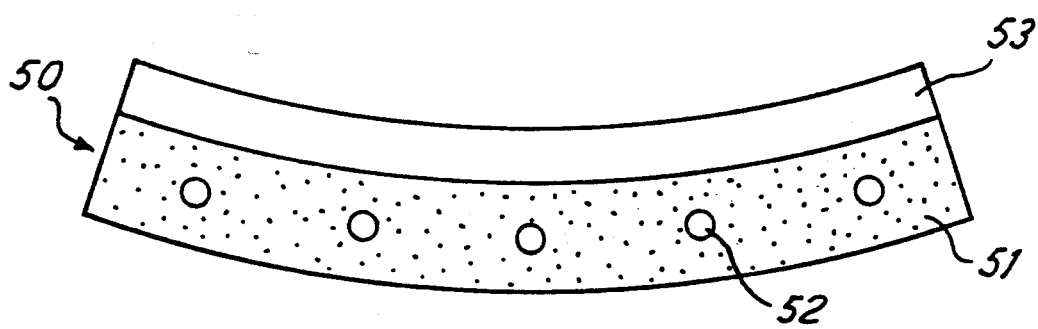

In FIG. 8, support 50 has a porous outer layer 51 in which are embedded pipes 52 to carry water for cooling layer 51, and a gas supply chamber 53.

Figure 9:
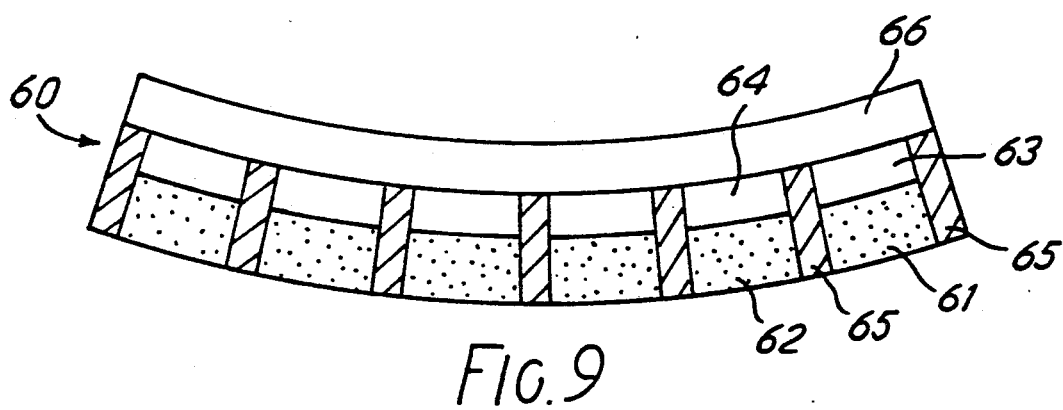

In FIG. 9, the exterior surface of support 60 is formed of sections of porous material, for example 61 and 62, each having a separate gas channel, 63 and 64 respectively, associated with the porous section, and metal bars 65 to conduct heat to water cooling chamber 66. Each gas channel can be separately supplied to give variation in gas flow around support 60 as required.

Figure 10:
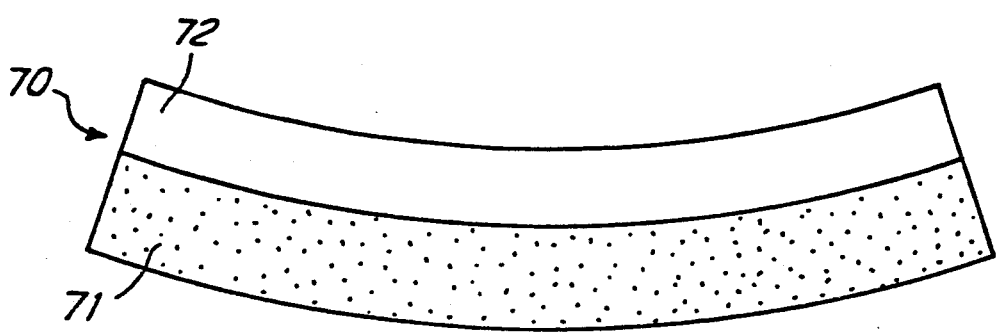

In FIG. 10 support 70 has a porous outer layer 71 and a chamber 72 for a fluid to function both as a coolant and as a supply of gas. Thus the coolant, and the operating temperature, is chosen such that an appropriate vapour pressure, for example 1 to 10 mbar, is generated between the support and the base One suitable coolant is water, as its vapour pressure is about 6 mbar at 0° C., 12 mbar at 10° C. and 23 mbar at 20° C.

The surface of the porous material in regions where no flow is required can be sealed with paint or resin; alternatively the surface can be machined to close the pores.

Figure 11:
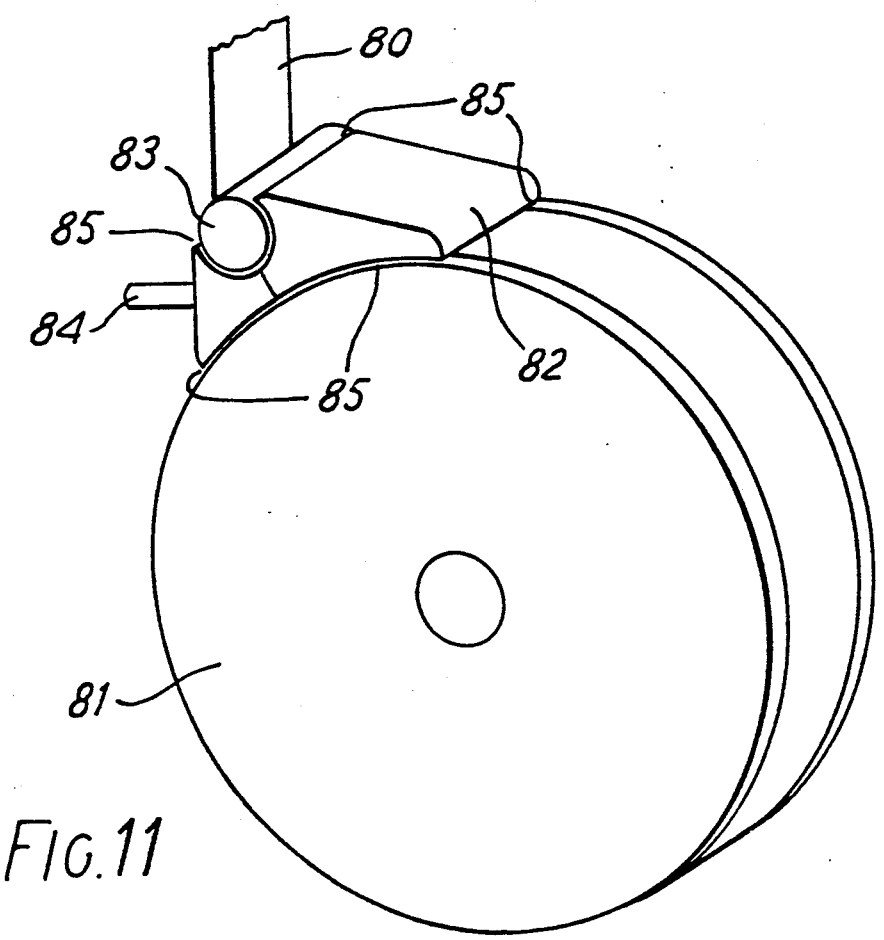
FIG. 11 shows a further modification to apparatus embodying the present invention.

FIG. 11 shows a further variant of apparatus embodying the present invention, which variant incorporates another arrangement to effect urging of gas between the base film amd the support. The features of this embodiment may be used in addition to, or as an alternative to, either or both of the previously described arrangements (i.e. the nozzle-injection and the porous support). The region of convergence between web 80 and the support 81 is enclosed in a hood 82 which fits closely to the support 81 and the idler roller 83 preceeding the support 81. The hood 82 is maintained full of gas at an appropriate pressure by a gas supply (not shown) with a feed pipe 84. The low conductance seals 85 permit the use of high pressures within the hood 82 without adversely affecting the chamber pressure. The apparatus is of particular advantage in single chamber vacuum metallisers where very little gas leakage into the evaporation region is permissible. The hood 82 may be made in a single piece or split into two parts (as shown) for ease of access.

An advantage of this arrangement is that it allows there to be a single zone, at vacuum, instead of separate winding zones and evaporation zones, thereby enabling lower-cost apparatus.

Other embodiments of the invention will be apparent to those skilled in the art, and the invention is suitable for use with a wide range of coating source materials and with a wide range of flexible web materials.

We claim:

1. A thin plastics web coating apparatus comprising:
   a coating-deposition station;
   transport means for transporting a thin plastics web, onto which a coating is to be deposited, in a web transport direction past the coating-deposition station;
   support means for supporting the web at the coating-deposition station;
   means for applying a substance onto the web by vapour deposition at the coating-deposition station to provide the coating to the web; and
   urging means for urging gas into a region in which the web and the support means converge for effective contact therebetween;
   wherein the support means presents a substantially smooth surface to the web, said surface including minute surface asperities enabling gas urged into said region to be entrained between the thin plastics web and the support means improving thermal coupling therebetween, the gas so entrained also acting to enable the thin plastics web to pass over the surface with a coefficient of friction therebetween which is reduced compared with that coefficient of friction which would obtain between the thin plastics web and the surface in the absence of said gas so entrained, thereby enabling the substance to be applied to the thin plastics web by vapour deposition at web transport speeds of up to ninety meters per minute without deformation of the thin plastics web.

2. An apparatus according to claim 1 wherein the urging means comprises means for infecting one jet or a plurality of spaced jets of gas to said region.

3. Apparatus according to claim 1 wherein the urging means comprises means for enclosing said region and means for maintaining a pressure of gas within the enclosing means to enable the gas to be entrained between the thin plastics web and the support means to improve the thermal coupling therebetween and to enable the thin plastics web to pass over the surface with a coefficient of friction therebetween which is reduced compared with that coefficient of friction which would obtain between the thin plastics web and the surface in the absence of said gas so entrained.

4. Apparatus according to claim 1 wherein the urging means comprises a conduit for the passage of gas to a nozzle which has at least one aperture for the output of a stream of gas.

5. Apparatus according to claim 1 wherein the support means has at least one section of porous material, said urging means comprising means for supplying gas to said at least one section of porous material.

6. Apparatus according to claim 1 wherein the support means comprises a rotatable drum with cooling means.

7. Apparatus according to claim 1 wherein the support means comprises a static guide plate.

8. Apparatus according to claim 1 wherein said reduced coefficient of friction is 0.01 or less.

9. Apparatus according to claim 1 wherein the urging means is arranged to provide the gas in the region in which the web and the support means converge at a localised pressure in the range of from one to ten millibars, such that the substance may be applied to the thin plastics web by vapour deposition at web transport speeds of between thirty and ninety metres per minute without deformation of the thin plastics web.

10. Apparatus according to claim 1 wherein the thin plastics web comprises a polyethylene terephthalate web of twelve microns thickness.

11. Apparatus according to claim 9 wherein the thin plastics web comprises a polyethylene terephthalate web of twelve microns thickness.

* * * * *